(12) United States Patent
Shibuya

(10) Patent No.: US 12,399,235 B2
(45) Date of Patent: Aug. 26, 2025

(54) MAGNETIC SENSOR ARRAY

(71) Applicant: TDK Corporation, Tokyo (JP)

(72) Inventor: Tomohiko Shibuya, Tokyo (JP)

(73) Assignee: TDK CORPORATION, Tokyo (JP)

( * ) Notice: Subject to any disclaimer, the term of this patent is extended or adjusted under 35 U.S.C. 154(b) by 182 days.

(21) Appl. No.: 18/009,778

(22) PCT Filed: May 27, 2021

(86) PCT No.: PCT/JP2021/020252
§ 371 (c)(1),
(2) Date: Dec. 12, 2022

(87) PCT Pub. No.: WO2021/256211
PCT Pub. Date: Dec. 23, 2021

(65) Prior Publication Data
US 2023/0258743 A1    Aug. 17, 2023

(30) Foreign Application Priority Data
Jun. 17, 2020 (JP) .................................. 2020-104819

(51) Int. Cl.
*G01R 33/00* (2006.01)
*G01R 33/09* (2006.01)

(52) U.S. Cl.
CPC ...... *G01R 33/0094* (2013.01); *G01R 33/0011* (2013.01); *G01R 33/091* (2013.01)

(58) Field of Classification Search
CPC ...... E04B 1/3441; F16C 11/00; Y10T 403/32; G01N 27/82
See application file for complete search history.

(56) References Cited

U.S. PATENT DOCUMENTS

| | | | | |
|---|---|---|---|---|
| 3,803,668 A | * | 4/1974 | Remick | E05D 11/06 16/380 |
| 2010/0146734 A1 | * | 6/2010 | Munson | E05D 5/121 16/337 |

(Continued)

FOREIGN PATENT DOCUMENTS

| WO | 2018/025829 A1 | 2/2018 |
|---|---|---|
| WO | 2019/077865 A1 | 4/2019 |

OTHER PUBLICATIONS

International Search Report issued in corresponding International Patent Application No. PCT/JP2021/020252, dated Jul. 27, 2021, with English translation.

(Continued)

*Primary Examiner* — Noam Reisner
(74) *Attorney, Agent, or Firm* — Rimon P.C.

(57) ABSTRACT

A magnetic sensor array includes a plurality of magnetic sensors. The magnetic sensor includes a sensor housing body housing the sensor chip and first and second connection parts formed on the sensor housing body. The first connection part formed on one of adjacent magnetic sensors and the second connection part formed on the other one thereof are axially supported on each other to achieve mutual connection between the plurality of magnetic sensors. Thus, it is possible to vary the relative angle between two adjacent magnetic sensors with the first and second connection parts as an axis. This allows the plurality of magnetic sensors to be pressed perpendicularly against even a curved surface of an object to be measured, and the pressed state can be easily maintained.

4 Claims, 7 Drawing Sheets

(56) References Cited

U.S. PATENT DOCUMENTS

| | | | |
|---|---|---|---|
| 2012/0002357 A1 | 1/2012 | Auld et al. | |
| 2018/0338684 A1 | 11/2018 | Goldhaber | |
| 2019/0133477 A1* | 5/2019 | Kawabata | A61B 5/242 |
| 2019/0167136 A1 | 6/2019 | Kawabata | |
| 2019/0391215 A1* | 12/2019 | Osaka | G01R 33/26 |
| 2020/0237243 A1 | 7/2020 | Kawabata et al. | |
| 2020/0315482 A1* | 10/2020 | Osaka | G01R 33/0047 |

OTHER PUBLICATIONS

Extended European Search Report dated on Jun. 5, 2024 issued in the corresponding European Patent Application No. 21825894.5.

\* cited by examiner

MAGNETIC SENSOR ARRAY

CROSS REFERENCE TO RELATED APPLICATIONS

This application is the U.S. National Phase under 35 U.S.C. § 371 of International Application No. PCT/JP2021/020252, filed on May 27, 2021, which claims the benefit of Japanese Patent Application No. 2020-104819, filed on Jun. 17, 2020, the entire contents of each are hereby incorporated by reference.

TECHNICAL FIELD

The present invention relates to a magnetic sensor array including a plurality of magnetic sensors and, more particularly, to a magnetic sensor array in which the angle between the plurality of magnetic sensors is variable.

BACKGROUND ART

Patent Document 1 discloses in FIG. 2 thereof a magnetic sensor array in which a plurality of magnetic sensors can be slid independently in one direction. Patent Document 1 further discloses in FIG. 14 thereof a magnetic sensor array in which a plurality of magnetic sensors are held by a holding part made of a flexible material. In these magnetic sensor arrays, a plurality of magnetic sensors can be brought close to even a curved surface of an object to be measured.

CITATION LIST

Patent Document

[Patent Document 1] International Publication WO 2018/02582.

SUMMARY OF THE INVENTION

Problem to be Solved by the Invention

However, in the magnetic sensor array illustrated in FIG. 2 of Patent Document 1, the magnetic sensors can be slid only in one direction and thus cannot be pressed perpendicularly against the surface of an object to be measured when the surface is a curved one. On the other hand, in the magnetic sensor array illustrated in FIG. 14 of Patent Document 1, although the magnetic sensors can be pressed perpendicularly against even a curved surface of an object to be measured, it is difficult to maintain a state where the magnetic sensors are pressed perpendicularly against the surface of an object to be measured due to a flexible holding part.

It is therefore an object of the present invention to provide a magnetic sensor array in which magnetic sensors constituting the magnetic sensor array can be pressed perpendicularly against even a curved surface of an object to be measured, and the pressed state can be easily maintained.

Means for Solving the Problem

A magnetic sensor array according to the present invention is a magnetic sensor array including a plurality of magnetic sensors. The magnetic sensors each include a sensor chip, a sensor housing body housing the sensor chip, and first and second connection parts formed on the sensor housing body. The first connection part formed on one of adjacent magnetic sensors and the second connection part formed on the other one thereof are axially supported on each other to achieve mutual connection between the plurality of magnetic sensors.

According to the present invention, it is possible to vary the relative angle between two adjacent magnetic sensors with the first and second connection parts as an axis. This allows the plurality of magnetic sensors to be pressed perpendicularly against even a curved surface of an object to be measured, and the pressed state can be easily maintained.

In the present invention, the sensor housing body may have a sensor head perpendicular to the sensitivity axis direction of the magnetic sensor and first and second side surfaces parallel to the sensitivity axis direction of the magnetic sensor and positioned on mutually opposite sides, the first connection part may be formed on the first side surface at a portion in a vicinity of the sensor head, and the second connection part may be formed on the second side surface at a portion in a vicinity of the sensor head. This arrangement makes it possible to deform the plurality of magnetic sensors connected in one direction into a fan shape.

In the present invention, the plurality of magnetic sensors may constitute a plurality of groups including first and second groups, at least one of the magnetic sensors belonging to the first group may further include a third connection part formed on the sensor housing body, at least one of the magnetic sensors belonging to the second group may further include a fourth connection part formed on the sensor housing body, and the first and second groups may be mutually connected with the third and fourth connection parts axially supported on each other. This makes it possible to vary the relative angle between the plurality of magnetic sensors belonging to the same group with the first and second connection parts as an axis and to vary the relative angle between the plurality of magnetic sensors belonging to different groups with the third and fourth connection parts as an axis.

In the present invention, the sensor housing body may further have third and fourth side surfaces parallel to the sensitivity axis direction of the magnetic sensor and perpendicular to the first and second side surfaces and are positioned on mutually opposite sides, the third connection part may be formed on the third side surface at a portion in a vicinity of the sensor head, and the fourth connection part may be formed on the fourth side surface at a portion in a vicinity of the sensor head. This makes it possible to deform a measurement surface constituted by the plurality of sensor heads into a spherical shape.

In the present invention, a rotary shaft axially supporting the first and second connection parts may be made of a non-magnetic material. This prevents the rotary axis from causing magnetic noise.

Advantageous Effects of the Invention

As described above, according to the present invention, there can be provided a magnetic sensor array in which magnetic sensors constituting the magnetic sensor array can be pressed perpendicularly against even a curved surface of an object to be measured, and the pressed state can be easily maintained.

MODE FOR CARRYING OUT THE INVENTION

Hereinafter, preferred embodiments of the present invention will be described in detail with reference to the accompanying drawings.

Figure 1:
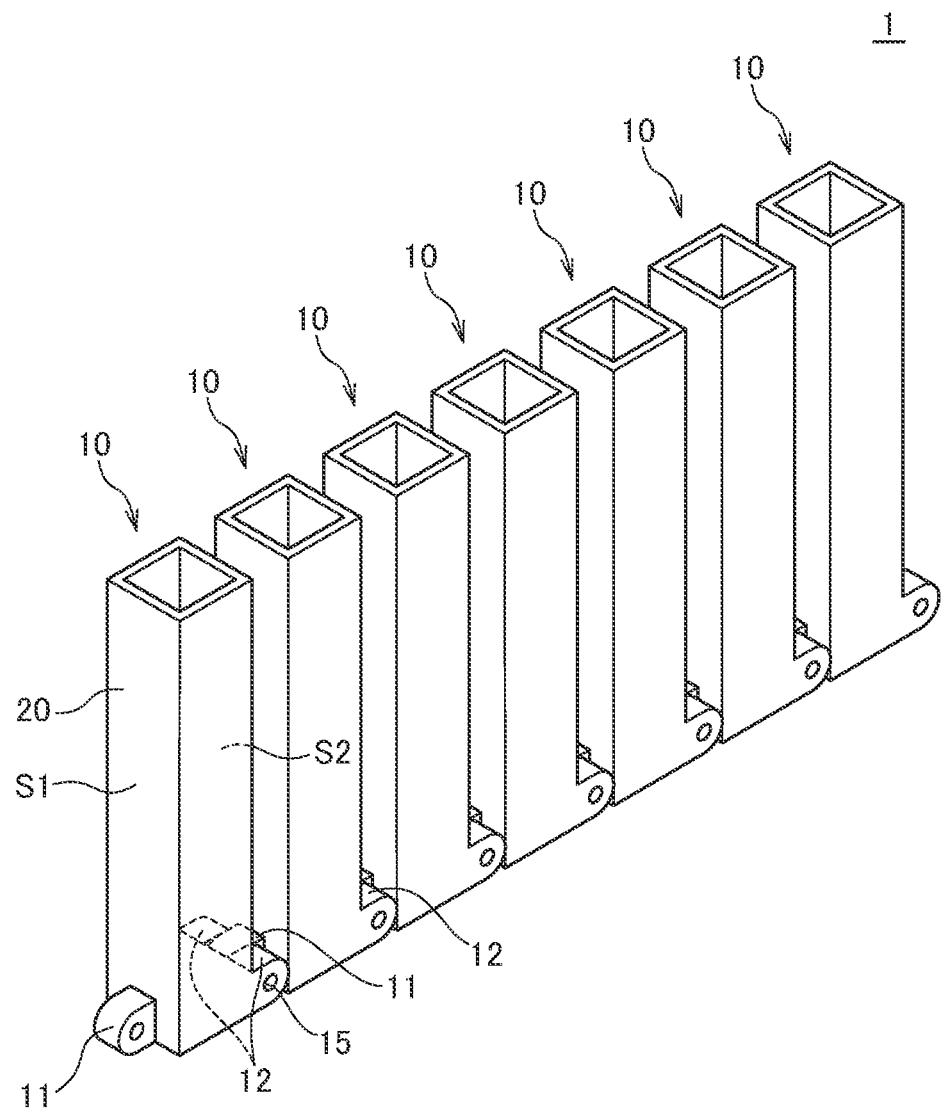
FIG. 1 is a schematic perspective view illustrating the outer appearance of a magnetic sensor array 1 according to a first embodiment of the present invention.

FIG. 1 is a schematic perspective view illustrating the outer appearance of a magnetic sensor array 1 according to a first embodiment of the present invention.

As illustrated in FIG. 1, the magnetic sensor array 1 according to the first embodiment has a configuration in which a plurality of magnetic sensors 10 each elongated in the z-direction are arranged in the x-direction. The sensitivity axis direction of each of the magnetic sensors is along the z-direction. In the example illustrated in FIG. 1, seven magnetic sensors 10 constitute the magnetic sensor array 1; however, the number of the magnetic sensors 10 constituting the magnetic sensor array 1 is not particularly limited to a specific number.

Each magnetic sensor 10 includes a sensor housing body 20, a connection part 11 formed on a side surface S1 of the sensor housing body 20, and a connection part 12 formed on a side surface S2 of the sensor housing body 20. The side surfaces S1 and S2 each constitute the yz surface and are positioned on mutually opposite sides. As illustrated in FIG. 1, each sensor housing body 20 has a pair of connection parts 12. The interval between the pair of connection parts 12 in the y-direction is substantially the same as or slightly smaller than the thickness of the connection part 11 in the y-direction, and the connection part 11 of one of the magnetic sensors 10 adjacent in the x-direction is inserted between the pair of connection parts 12 of the other one thereof. Then, a rotary shaft 15 is inserted into through holes formed in the connection parts 11 and 12, whereby the connection parts 11 and 12 are axially supported on each other by the rotary shaft 15. The axial direction of the rotary shaft 15 is along the y-direction and does not overlap the magnetic sensor 10. The material constituting the rotary shaft 15 is not particularly restricted as long as it can axially rotatably support the connection parts 11 and 12 and may be constituted by a screw or an elastic body. The rotary shaft 15 is preferably made of a non-magnetic material.

Figure 2:
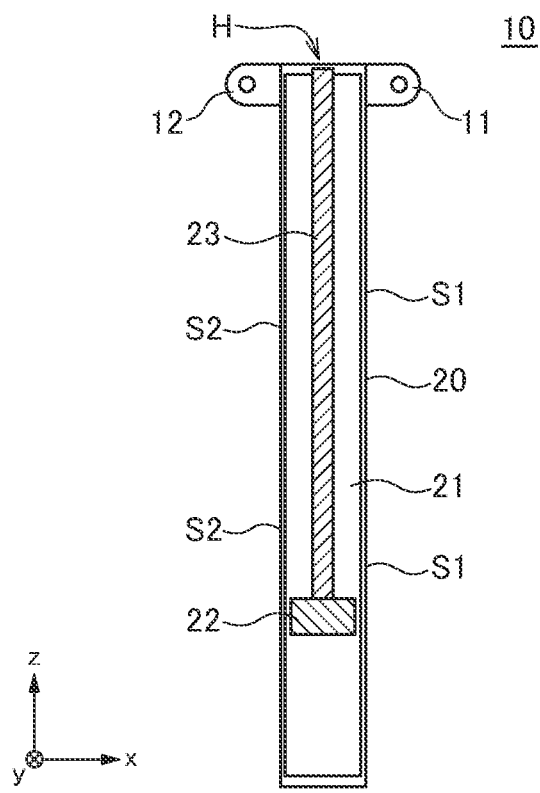
FIG. 2 is a schematic view illustrating an example of the internal structure of the magnetic sensor 10.

FIG. 2 is a schematic view illustrating an example of the internal structure of the magnetic sensor 10.

As illustrated in FIG. 2, the magnetic sensor 10 includes a sensor housing body 20 made of a non-magnetic material, a substrate 21 housed in the sensor housing body 20, a sensor chip 22, and a magnetism collector 23. The sensor chip 22 and magnetism collector 23 are mounted on the substrate 21. The magnetism collector 23 has a rod-like shape extending in the z-direction and is made of a high permeability material such as ferrite. The xy surface of the sensor housing body 20 at which one end of the magnetism collector 23 in the z-direction is positioned constitutes a sensor head H, and the sensor chip 22 is disposed at the other end of the magnetism collector 23 in the z-direction. With this configuration, a signal magnetic field component in the z-direction emitted from an object to be measured positioned in the vicinity of the sensor head H is collected by the magnetism collector 23 to be applied to the sensor chip 22.

As described above, the sensor housing body 20 has the connection parts 11 and 12. The connection part 11 is formed on the side surface S1 at a portion in the vicinity of the sensor head H, and the connection part 12 is formed on the side surface S2 at a portion in the vicinity of the sensor head H.

Figure 3:
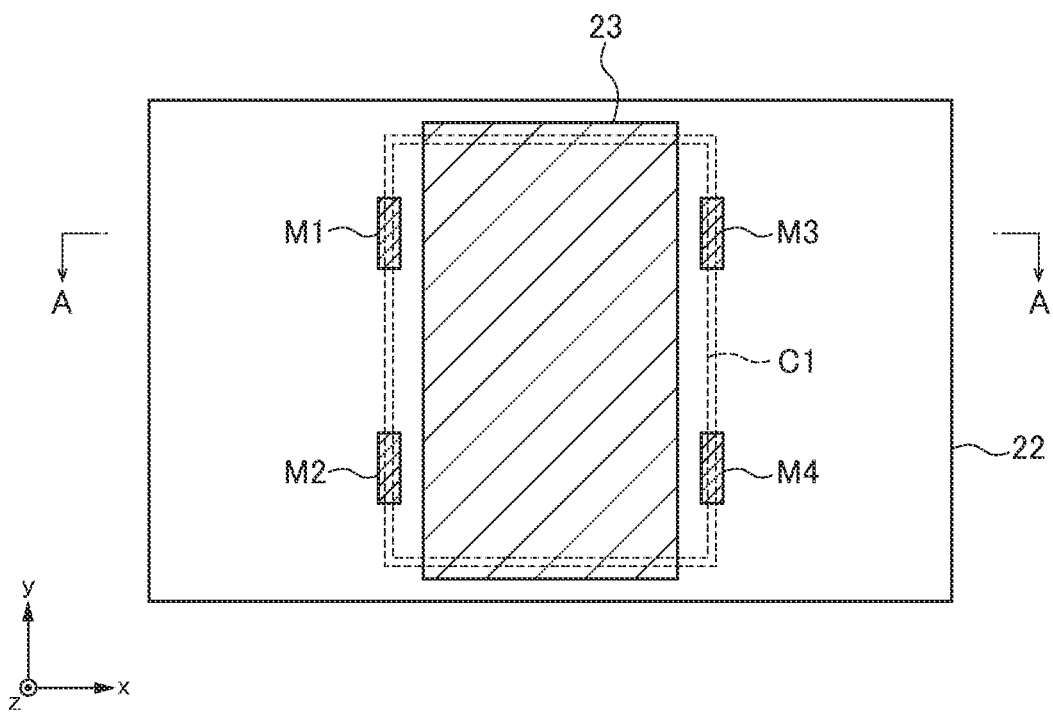
FIG. 3 is a schematic plan view of the sensor chip 22.
Figure 4:
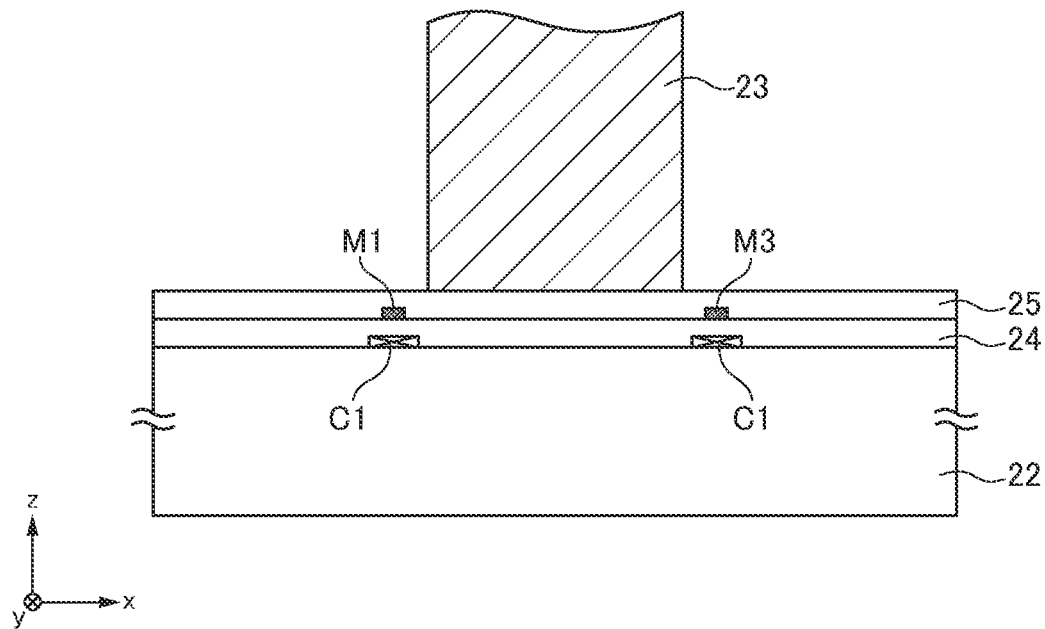
FIG. 4 is a cross-sectional view taken along the line A-A in FIG. 3.

FIG. 3 is a schematic plan view of the sensor chip 22, and FIG. 4 is a cross-sectional view taken along the line A-A in FIG. 3.

As illustrated in FIGS. 3 and 4, the sensor chip 22 has, on its element formation surface, four magnetoresistance effect elements M1 to M4 and a cancel coil C1. The cancel coil C1 is covered with an insulating film 24, and the magnetoresistance effect elements M1 to M4 are formed on the insulating film 24. The magnetoresistance effect elements M1 to M4 are covered with an insulating film 25. The magnetism collector 23 is disposed between the magnetoresistance effect elements M1, M2 and the magnetoresistance effect elements M3, M4 as viewed in the z-direction. With this configuration, a magnetic field in the z-direction collected by the magnetism collector 23 is distributed in the positive x-direction and the negative x-direction on the element formation surface of the sensor chip 22. As a result, magnetic field components in mutually opposite directions are applied to the magnetoresistance effect elements M1, M2 and magnetoresistance effect elements M3, M4. The fixed magnetization directions of the magnetoresistance effect elements M1 to M4 are made uniform in the positive x-direction or negative x-direction.

The cancel coil C1 is disposed so as to overlap the magnetoresistance effect elements M1 to M4. When a cancel current is made to flow in the cancel coil C1, cancel magnetic fields in mutually opposite directions are applied to the magnetoresistance effect elements M1, M2 and magnetoresistance effect elements M3, M4.

Figure 5:
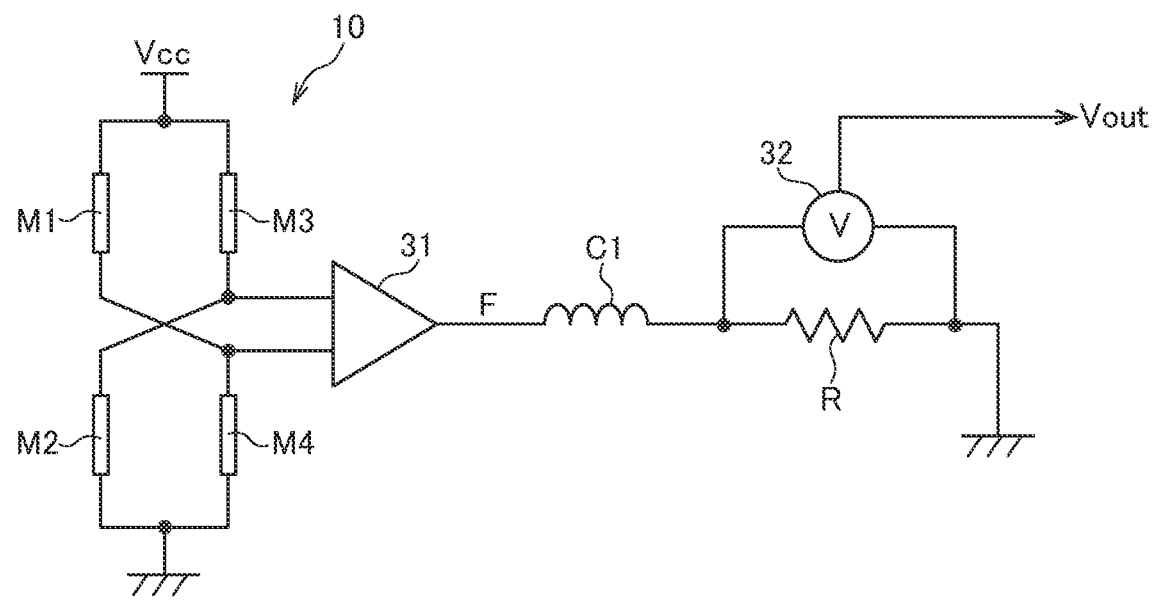
FIG. 5 is a circuit diagram of the magnetic sensor 10.

FIG. 5 is a circuit diagram of the magnetic sensor 10.

As illustrated in FIG. 5, the magnetoresistance effect elements M1 to M4 included in the magnetic sensor 10 are bridge-connected, and a differential signal generated thereby is supplied to a differential amplifier 31. The differential amplifier 31 generates a feedback current F1 based on the supplied differential signal. The feedback current F1 flows in the cancel coil C1. This causes the cancel coil C1 to generate a cancel magnetic field so as to make a differential signal component which is an output signal of the magnetic sensor 10 zero. The feedback current F is current-voltage converted by a resistor R, and a detection signal Vout proportional to the feedback current F is generated by a voltage measurement circuit 32 measuring the voltage across the resistor R.

Figure 6:
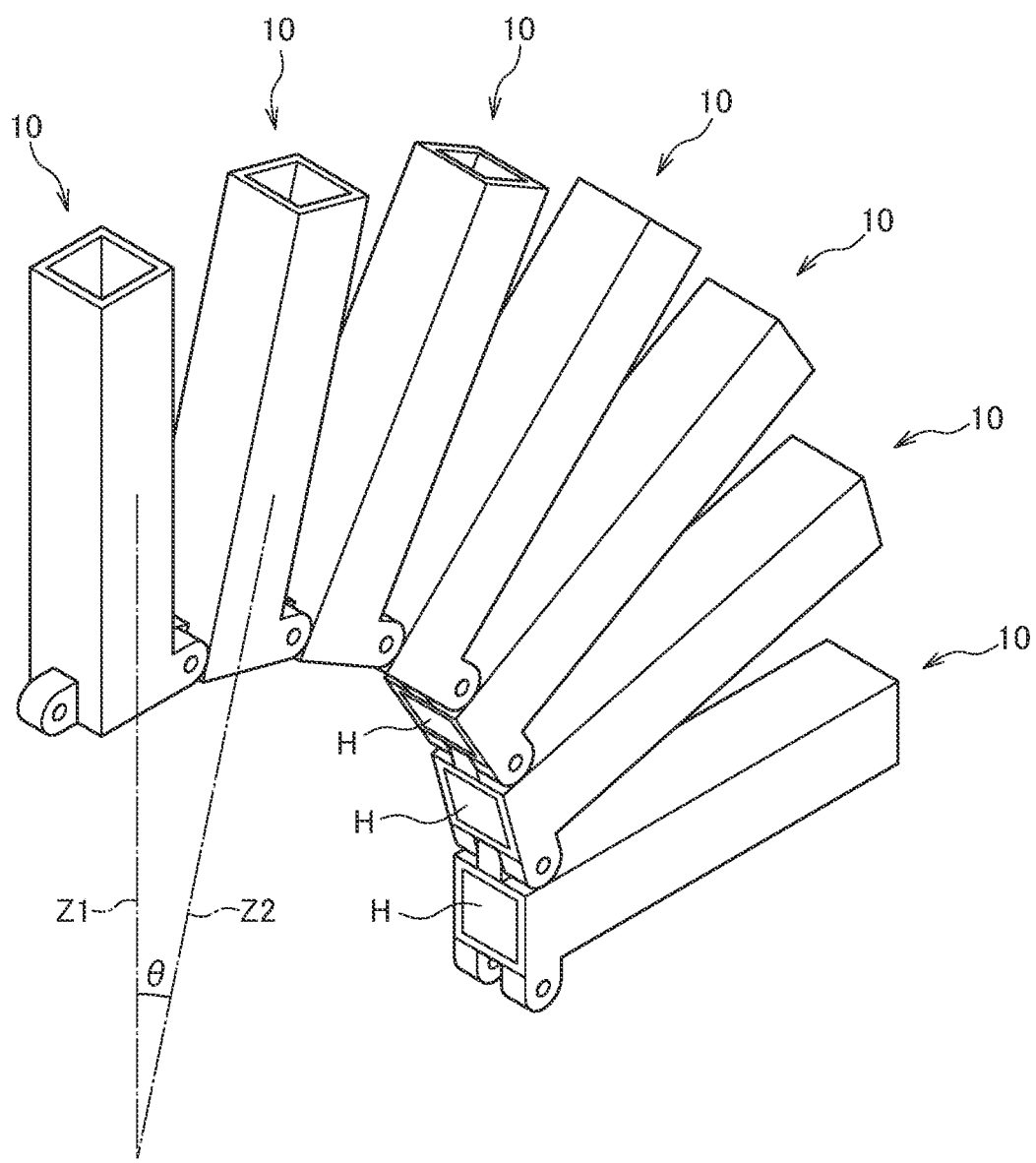
FIG. 6 is a schematic perspective view illustrating a state where the magnetic sensor array 1 is deformed.

FIG. 6 is a schematic perspective view illustrating a state where the magnetic sensor array 1 according to the present embodiment is deformed.

As illustrated in FIG. 6, by deforming the magnetic sensor array 1 around the rotary shaft 15, an angle θ between two adjacent magnetic sensors 10 can be varied. The long dashed dotted lines Z1 and Z2 illustrated in FIG. 6 denotes the sensitivity axis directions of the respective two adjacent magnetic sensors 10. By thus deforming the magnetic sensor array 1 constituted by the plurality of magnetic sensors 10 into a fan shape, a measurement surface constituted by the sensor heads H of the magnetic sensors 10 can be made into a circular-arc shape. This allows the sensor heads H of the magnetic sensors 10 to be pressed perpendicularly against even a curved surface of an object to be measured. This deformation state of the magnetic sensor array 1 can be maintained by friction force of the rotary shaft 15. To reliably maintain the posture of the magnetic sensor array 1, a screw may be used as the rotary shaft 15 and fixed by a nut. In this case as well, the screw and nut are preferably made of a non-magnetic material.

As described above, in the magnetic sensor array 1 according to the present embodiment, the plurality of magnetic sensors 10 are connected through the rotary shafts 15, thereby allowing the shape of the measurement surface constituted by the plurality of sensor heads to be varied in accordance with the surface shape of an object to be measured.

Figure 7:
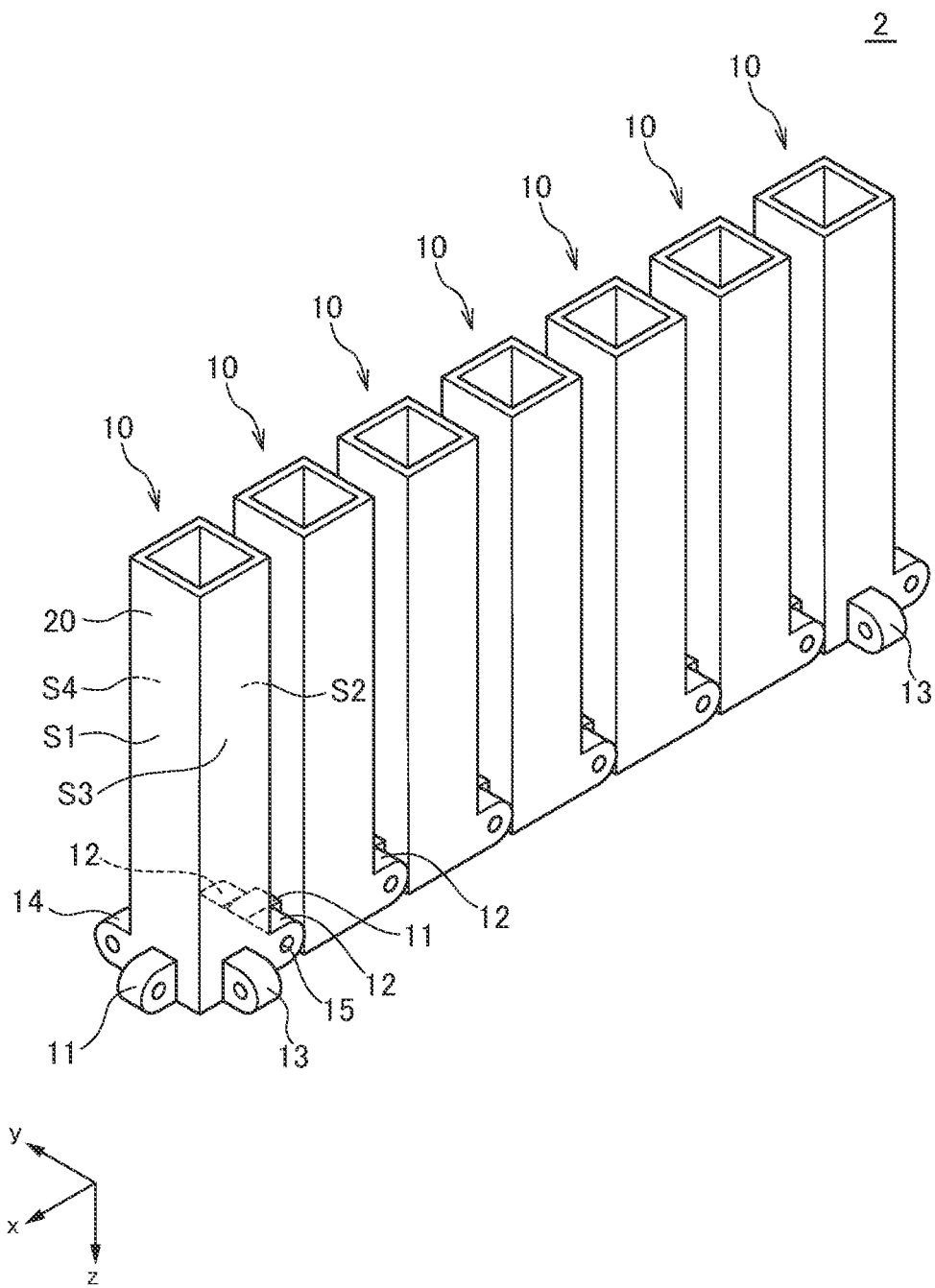
FIG. 7 is a schematic perspective view illustrating the outer appearance of a magnetic sensor array 2 according to a second embodiment of the present invention.

FIG. 7 is a schematic perspective view illustrating the outer appearance of a magnetic sensor array 2 according to a second embodiment of the present invention.

As illustrated in FIG. 7, the magnetic sensor array 2 according to the second embodiment differs from the magnetic sensor array 1 according to the first embodiment in that connection parts 13 and 14 are formed on the sensor housing bodies 20 of the respective magnetic sensors 10 positioned at both end portions in the x-direction. Other basic configurations are the same as those of the magnetic sensor array 1 according to the first embodiment, so the same reference numerals are given to the same elements, and overlapping description will be omitted.

The connection parts 13 and 14 are formed respectively on side surfaces S3 and S4 of the sensor housing body 20, and the positions thereof in the z-direction are the same as those of the connection parts 11 and 12. The connection part 13 has the same shape as the connection part 11, and the connection part 14 has the same shape as the connection part 12. The side surfaces S3 and S4 each constitute the xz surface and are positioned on mutually opposite sides. With this configuration, a plurality of the magnetic sensor arrays 2 according to the second embodiment can be connected in the y-direction.

Figure 8:
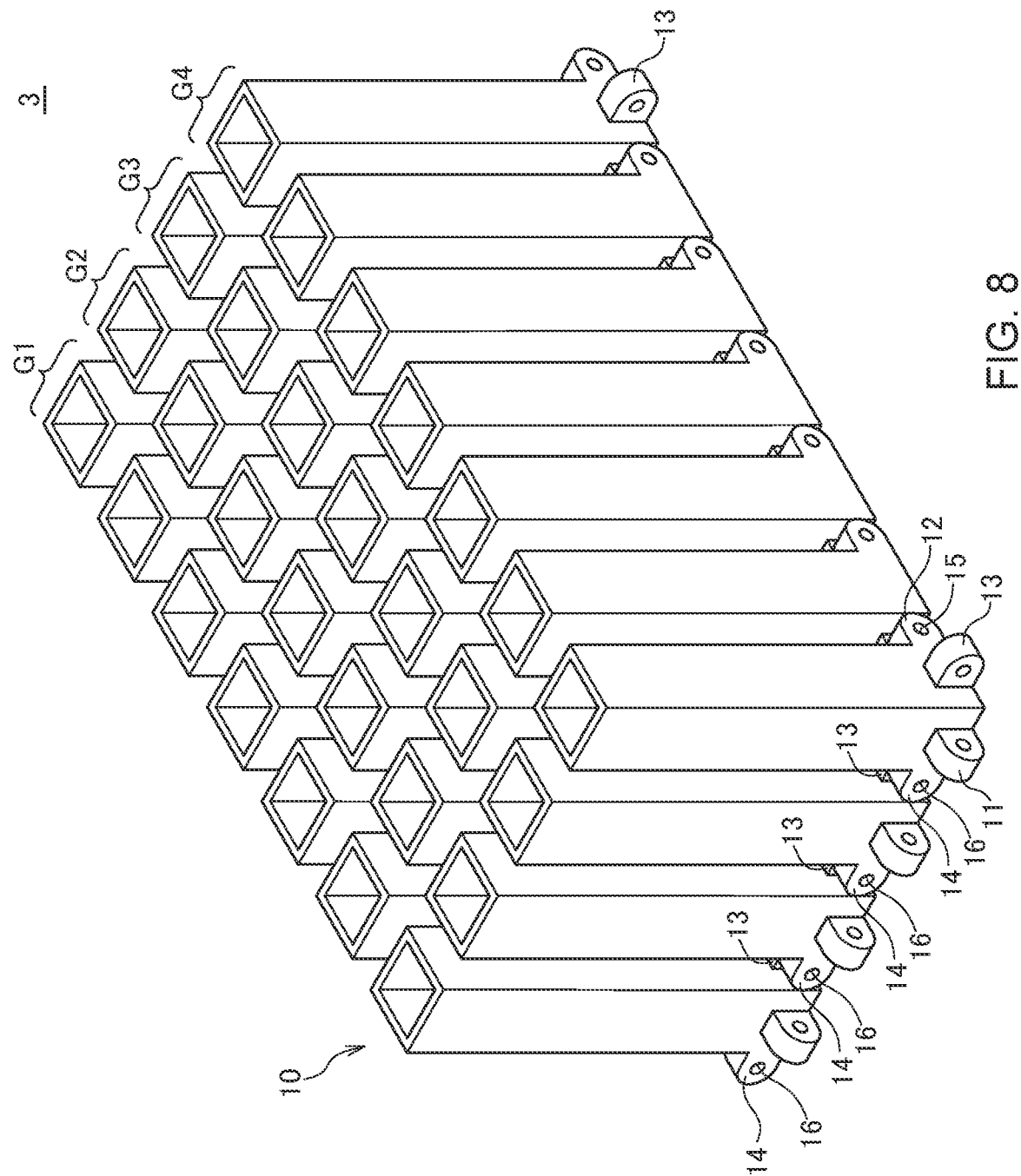
FIG. 8 is a schematic perspective view illustrating the outer appearance of a magnetic sensor array 3 according to a third embodiment of the present invention.

FIG. 8 is a schematic perspective view illustrating the outer appearance of a magnetic sensor array 3 according to a third embodiment of the present invention.

As illustrated in FIG. 8, the magnetic sensor array 3 according to the third embodiment has a configuration obtained by connecting the plurality of magnetic sensor arrays 2 according to the second embodiment in the y-direction. The magnetic sensor array 3 in the example illustrated in FIG. 8 has groups G1 to G4 each having the same configuration as the magnetic sensor array 2 according to the second embodiment. Specifically, the connection parts 13 belonging to one (e.g., group G1) of the groups adjacent in the y-direction and the connection part 14 belonging to the other one (e.g., group G2) thereof are axially supported on each other by rotary shafts 16, whereby the groups G1 to G4 are connected in the y-direction. The axial direction of the rotary shaft 16 is along the x-direction and does not overlap the magnetic sensor 10. The rotary shaft 16 can be made of the same material as the rotary shaft 15.

Figure 9:
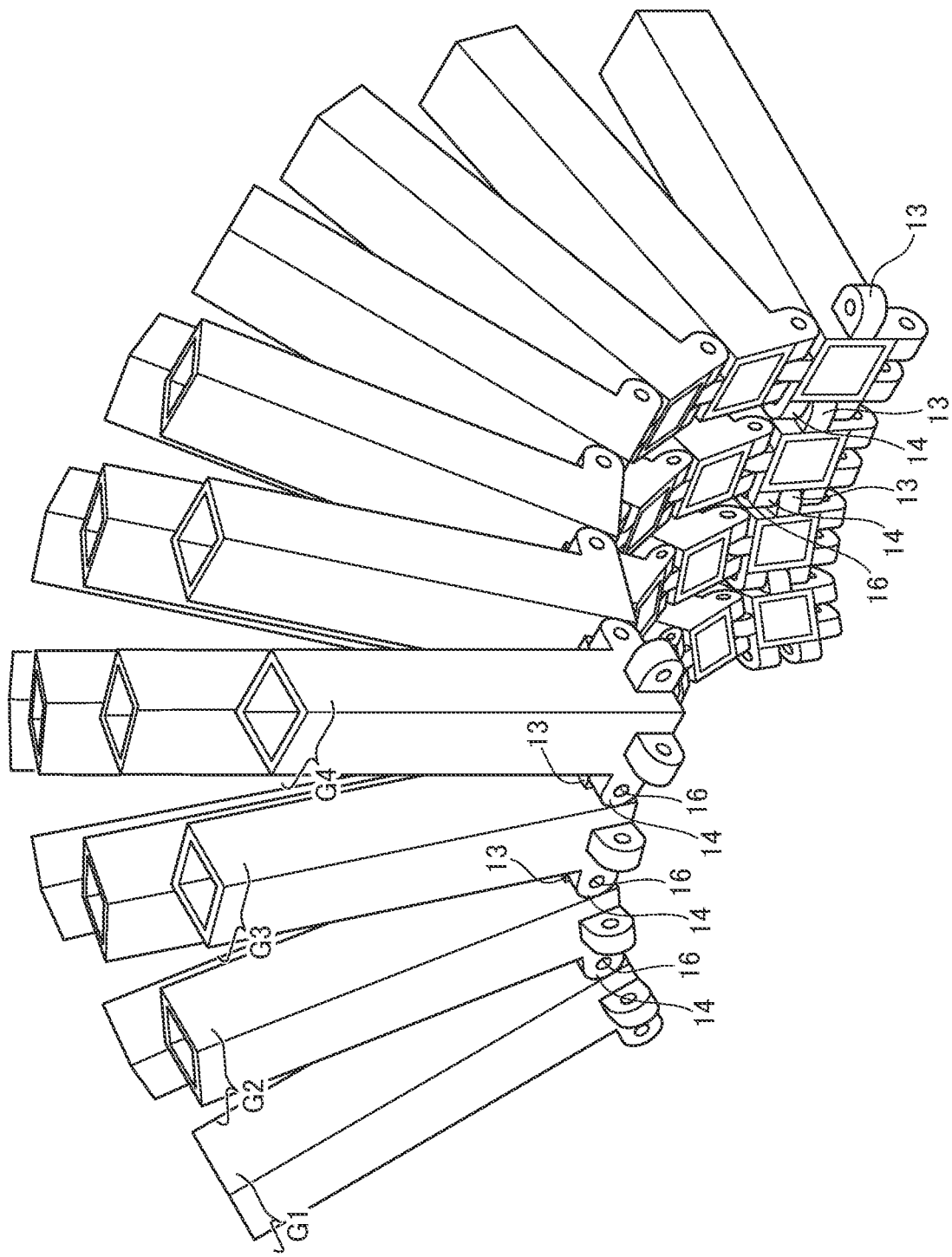
FIG. 9 is a schematic perspective view illustrating a state where the magnetic sensor array 3 is deformed.

FIG. 9 is a schematic perspective view illustrating a state where the magnetic sensor array 3 according to the present embodiment is deformed. As illustrated in FIG. 9, by varying the angles of the magnetic sensors 10 constituting the magnetic sensor array 3 around the rotary shafts 15 and 16, a measurement surface constituted by the sensor heads H can be deformed into a spherical shape.

While the preferred embodiment of the present invention has been described, the present invention is not limited to the above embodiment, and various modifications may be made within the scope of the present invention, and all such modifications are included in the present invention.

REFERENCE SIGNS LIST

1-3 magnetic sensor array
10 magnetic sensor
11-14 connection part
15, 16 rotary shaft
20 sensor housing body
21 substrate
22 sensor chip
23 magnetism collector
24, 25 insulating film
31 differential amplifier
32 voltage measurement circuit
C1 cancel coil
F feedback current
G1-G4 group
H sensor head
M1-M4 magnetoresistance effect element
R resistor
S1-S4 side surface

What is claimed is:

1. A magnetic sensor array comprising a plurality of magnetic sensors each elongated in a sensitivity axis direction thereof,
    wherein each of the magnetic sensors includes a substrate elongated in the sensitivity axis direction, a magnetism collector mounted on the substrate and elongated in the sensitivity axis direction, a sensor chip mounted on the substrate so as to face one end of the magnetism collector in the sensitivity axis direction, and a sensor housing body,
    wherein the sensor housing body is larger in length in the sensitivity axis direction than the substrate so as to house therein the substrate, the magnetism collector, and the sensor chip,
    wherein the sensor housing body has a sensor head positioned at another end of the magnetism collector in the sensitivity axis direction, first and second side surfaces parallel to the sensitivity axis direction and positioned on mutually opposite sides, a first connection part formed on the first side surface at a portion in a vicinity of the sensor head, and a pair of second connection parts formed on the second side surface at a portion in a vicinity of the sensor head, and
    wherein the first connection part formed on one of adjacent magnetic sensors and the pair of second connection parts formed on other one thereof are axially supported on each other such that the first connection part is sandwiched between the pair of second connection parts to achieve mutual connection between the plurality of magnetic sensors.

2. The magnetic sensor array as claimed in claim 1,
    wherein the plurality of magnetic sensors constitute a plurality of groups including first and second groups,
    wherein the sensor housing body of at least one of the magnetic sensors belonging to the first group further has a third connection part, wherein the sensor housing body of at least one of the magnetic sensors belonging to the second group further has a fourth connection part, and wherein the first and second groups are mutually connected with the third and fourth connection parts axially supported on each other.

3. The magnetic sensor array as claimed in claim 2, wherein the sensor housing body further has third and fourth side surfaces parallel to the sensitivity axis direction of the magnetic sensor and perpendicular to the first and second side surfaces and are positioned on mutually opposite sides, wherein the third connection part is formed on the third side surface at a portion in a vicinity of the sensor head, and wherein the fourth connection part is formed on the fourth side surface at a portion in a vicinity of the sensor head.

4. The magnetic sensor array as claimed in claim 1, wherein a rotary shaft axially supporting the first connection part and the pair of second connection parts is a screw made of a non-magnetic material.

* * * * *